United States Patent
Johnson

(10) Patent No.: US 10,231,337 B2
(45) Date of Patent: Mar. 12, 2019

(54) FOLDED PRINTED CIRCUIT ASSEMBLIES AND RELATED METHODS

(71) Applicant: Inertial Sense, Inc., Salem, UT (US)

(72) Inventor: Walter H. Johnson, Salem, UT (US)

(73) Assignee: Inertial Sense, Inc., Salem, UT (US)

( * ) Notice: Subject to any disclaimer, the term of this patent is extended or adjusted under 35 U.S.C. 154(b) by 262 days.

(21) Appl. No.: 14/971,660

(22) Filed: Dec. 16, 2015

(65) Prior Publication Data

US 2016/0174378 A1    Jun. 16, 2016

Related U.S. Application Data

(60) Provisional application No. 62/092,728, filed on Dec. 16, 2014.

(51) Int. Cl.
*H05K 1/14* (2006.01)

(52) U.S. Cl.
CPC ............ *H05K 1/147* (2013.01); *H05K 1/148* (2013.01); *H05K 1/144* (2013.01); *H05K 2201/042* (2013.01)

(58) Field of Classification Search
None
See application file for complete search history.

(56) References Cited

U.S. PATENT DOCUMENTS

| | | |
|---|---|---|
| 4,038,876 A | 8/1977 | Morris |
| 5,224,023 A * | 6/1993 | Smith ............... G06F 1/184 174/254 |
| 5,422,817 A | 6/1995 | Tazartes et al. |
| 5,615,132 A | 3/1997 | Horton et al. |
| 5,819,206 A | 10/1998 | Horton et al. |
| 5,956,234 A * | 9/1999 | Mueller ............ H05K 1/141 361/749 |
| 6,145,378 A | 11/2000 | McRobbie et al. |
| 6,219,616 B1 | 4/2001 | Litmanovich et al. |
| 6,266,583 B1 | 7/2001 | Tazartes et al. |
| 6,278,945 B1 | 8/2001 | Lin |
| 6,311,129 B1 | 10/2001 | Lin |
| 6,408,245 B1 | 6/2002 | An et al. |
| 6,415,223 B1 | 7/2002 | Lin et al. |
| 6,415,227 B1 | 7/2002 | Lin |
| 6,421,622 B1 | 7/2002 | Horton et al. |
| 6,424,914 B1 | 7/2002 | Lin |
| 6,427,122 B1 | 7/2002 | Lin |
| 6,427,131 B1 | 7/2002 | McCall et al. |
| 6,449,559 B2 | 9/2002 | Lin |

(Continued)

*Primary Examiner* — Barbara J Musser
(74) *Attorney, Agent, or Firm* — Matthew D. Thayne; Thayne and Davis LLC

(57) ABSTRACT

Printed circuit assemblies comprising two or more printed circuit boards stacked and/or folded together and related methods. In some embodiments, a first printed circuit board comprising a first plurality of electrical components may be coupled with a second printed circuit board comprising a second plurality of electrical components using a flexible coupling member. The first printed circuit board may be stacked on top of the second printed circuit board and coupled using an adhesive layer positioned in between the first printed circuit board and the second printed circuit board. The adhesive layer may be configured to maintain the first printed circuit board in a stacked configuration with respect to the second printed circuit board.

11 Claims, 16 Drawing Sheets

(56) References Cited

U.S. PATENT DOCUMENTS

| | | | |
|---|---|---|---|
| 6,473,713 B1 | 10/2002 | McCall et al. |
| 6,477,465 B1 | 11/2002 | McCall et al. |
| 6,480,152 B2 | 11/2002 | Lin et al. |
| 6,493,631 B1 | 12/2002 | Burns |
| 6,494,093 B2 | 12/2002 | McCall et al. |
| 6,522,992 B1 | 2/2003 | McCall et al. |
| 6,618,004 B2 | 9/2003 | Fenton et al. |
| 6,622,090 B2 | 9/2003 | Lin |
| 6,631,323 B2 | 10/2003 | Tucker et al. |
| 6,634,207 B1 | 10/2003 | Lottman et al. |
| 6,647,352 B1 | 11/2003 | Horton |
| 6,658,354 B2 | 12/2003 | Lin |
| 6,664,923 B1 | 12/2003 | Ford |
| 6,671,622 B2 | 12/2003 | McCall et al. |
| 6,671,648 B2 | 12/2003 | McCall et al. |
| 6,697,736 B2 | 2/2004 | Lin |
| 6,697,758 B2 | 2/2004 | McCall et al. |
| 6,721,657 B2 | 4/2004 | Ford et al. |
| 6,725,173 B2 | 4/2004 | An et al. |
| 6,738,714 B2 | 5/2004 | McCall et al. |
| 6,750,816 B1 | 6/2004 | Kunysz |
| 6,757,569 B2 | 6/2004 | Lin |
| 6,792,353 B2 | 9/2004 | Lin |
| 6,834,436 B2 | 12/2004 | Townsend et al. |
| 6,853,947 B1 | 2/2005 | Horton |
| 6,879,875 B1 | 4/2005 | Hu et al. |
| 6,892,575 B2 | 5/2005 | Nasiri et al. |
| 7,104,129 B2 | 9/2006 | Nasiri et al. |
| 7,143,004 B2 | 11/2006 | Townsend et al. |
| 7,162,367 B2 | 1/2007 | Lin et al. |
| 7,193,559 B2 | 3/2007 | Ford et al. |
| 7,210,240 B2 | 5/2007 | Townsend et al. |
| 7,216,055 B1 | 5/2007 | Horton et al. |
| 7,250,353 B2 | 7/2007 | Nasiri et al. |
| 7,280,916 B2 | 10/2007 | Bang et al. |
| 7,290,435 B2 | 11/2007 | Seeger et al. |
| 7,346,452 B2 | 3/2008 | Ford et al. |
| 7,366,612 B2 | 4/2008 | Yang et al. |
| 7,409,290 B2 | 8/2008 | Lin |
| 7,418,364 B1 | 8/2008 | Horton et al. |
| 7,426,859 B2 | 9/2008 | Greene et al. |
| 7,458,263 B2 | 12/2008 | Nasiri et al. |
| 7,528,770 B2 | 5/2009 | Ford et al. |
| 7,544,263 B2 * | 6/2009 | dela Cruz ............... H01L 25/50 156/226 |
| 7,548,835 B2 | 6/2009 | Lin |
| 7,621,183 B2 | 11/2009 | Seeger et al. |
| 7,672,781 B2 | 3/2010 | Chruchill et al. |
| 7,677,099 B2 | 3/2010 | Nasiri et al. |
| 7,725,279 B2 | 5/2010 | Luinge et al. |
| 7,832,111 B2 | 11/2010 | Lagouge et al. |
| 7,863,698 B2 | 1/2011 | Seeger et al. |
| 8,010,308 B1 | 8/2011 | Churchill |
| 8,020,441 B2 | 9/2011 | Seeger et al. |
| 8,047,075 B2 | 11/2011 | Nasiri et al. |
| 8,065,074 B1 | 11/2011 | Liccardo |
| 8,069,726 B2 | 12/2011 | Seeger et al. |
| 8,141,424 B2 | 3/2012 | Seeger et al. |
| 8,165,844 B2 | 4/2012 | Luinge et al. |
| 8,183,944 B2 | 5/2012 | Seeger et al. |
| 8,186,217 B2 | 5/2012 | Veltink |
| 8,203,487 B2 | 6/2012 | Hol et al. |
| 8,250,921 B2 | 8/2012 | Nasiri et al. |
| 8,310,380 B2 | 11/2012 | Aria et al. |
| 8,326,533 B2 | 12/2012 | Sachs |
| 8,344,948 B2 | 1/2013 | Hol et al. |
| 8,522,612 B1 | 9/2013 | Kubena |
| 8,594,971 B2 | 11/2013 | Keal et al. |
| 8,688,375 B2 | 4/2014 | Funk et al. |
| 8,706,414 B2 | 4/2014 | Funk et al. |
| 8,712,686 B2 | 4/2014 | Bandyopadhyay et al. |
| 8,751,151 B2 | 6/2014 | Funk et al. |
| 8,756,001 B2 | 6/2014 | Georgy et al. |
| 8,930,163 B2 | 1/2015 | Kordari et al. |
| 8,947,206 B2 | 2/2015 | Dijkstra et al. |
| 8,952,785 B2 | 2/2015 | Dijkstra et al. |
| 8,965,736 B2 | 2/2015 | Horton et al. |
| 8,981,904 B2 | 3/2015 | Luinge et al. |
| 2009/0016033 A1 * | 1/2009 | Chow ............... H01L 23/5387 361/749 |
| 2010/0198511 A1 | 8/2010 | Hunter et al. |
| 2011/0028865 A1 | 2/2011 | Luinge et al. |
| 2011/0046915 A1 | 2/2011 | Hol et al. |
| 2011/0109438 A1 | 5/2011 | Dijkstra et al. |
| 2012/0221244 A1 | 8/2012 | Georgy et al. |
| 2012/0223846 A1 | 9/2012 | Luinge et al. |
| 2012/0226468 A1 | 9/2012 | Dijkstra et al. |
| 2012/0232847 A1 | 9/2012 | Horton et al. |
| 2012/0245839 A1 | 9/2012 | Georgy et al. |
| 2013/0211713 A1 | 8/2013 | Georgy et al. |
| 2013/0311134 A1 | 11/2013 | Kordari et al. |
| 2013/0317741 A1 | 11/2013 | Brashear et al. |
| 2014/0081592 A1 | 3/2014 | Bellusci et al. |
| 2014/0114569 A1 | 4/2014 | Qi |
| 2014/0130595 A1 | 5/2014 | Zhao et al. |

* cited by examiner

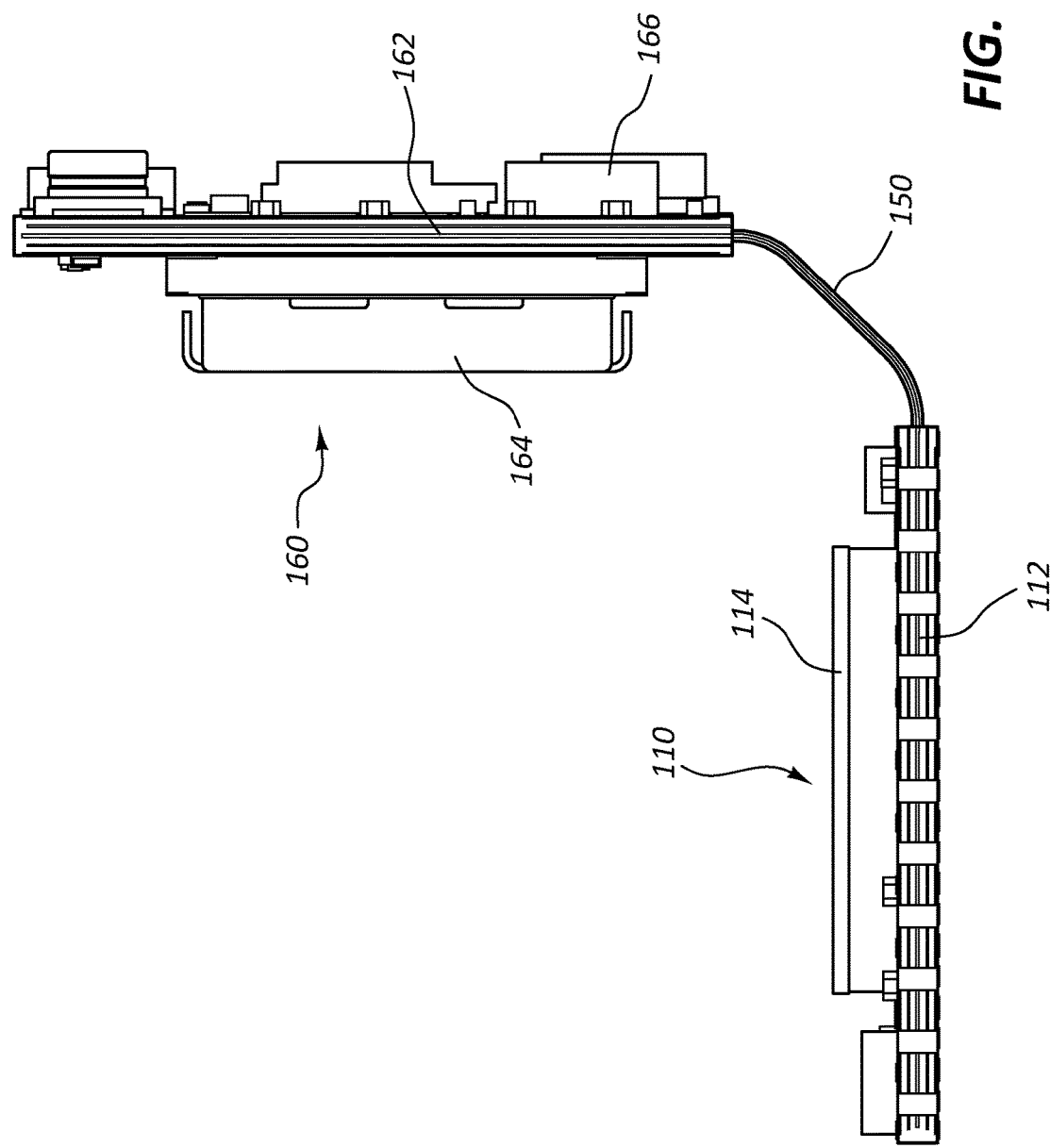

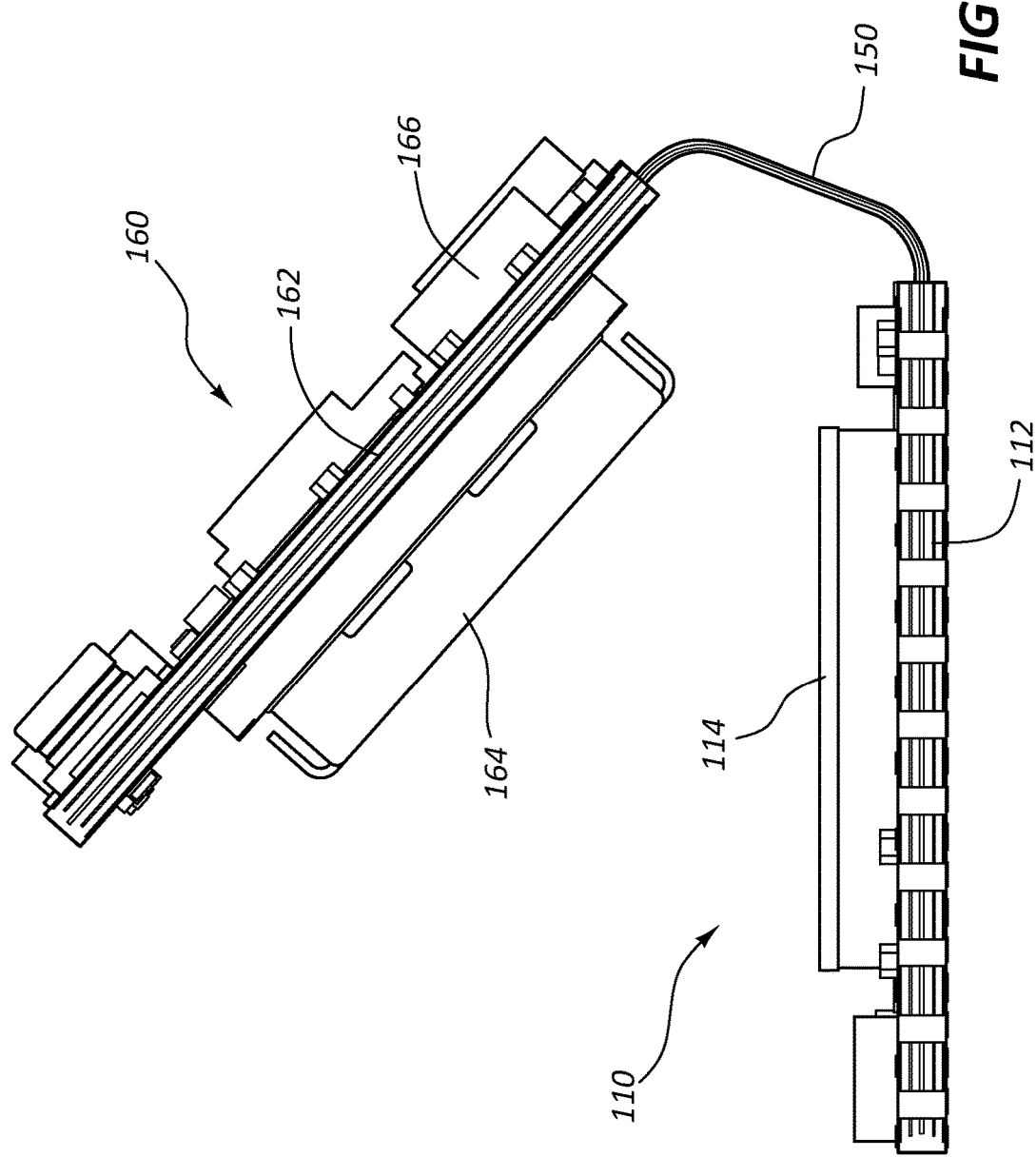

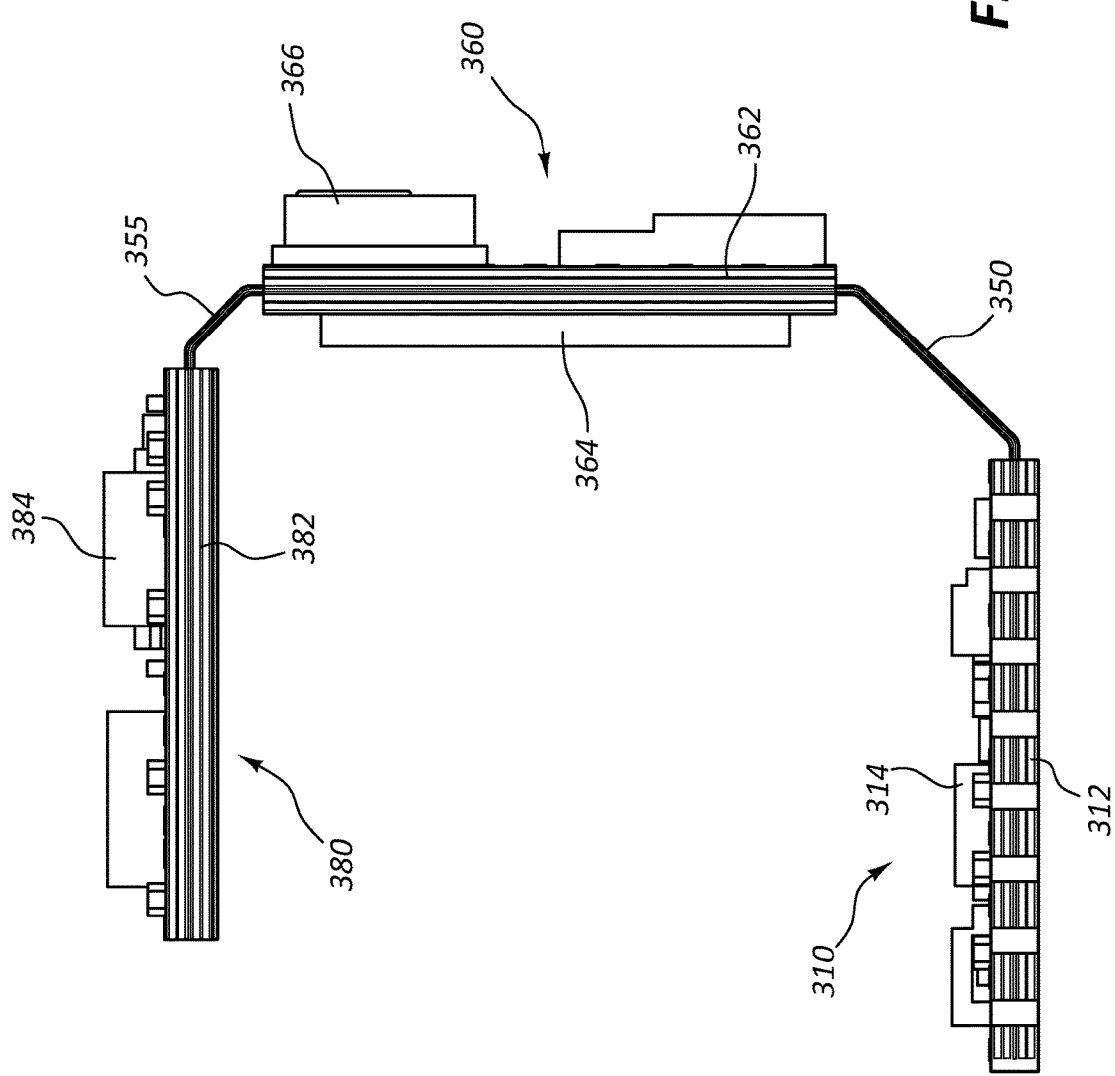

FOLDED PRINTED CIRCUIT ASSEMBLIES AND RELATED METHODS

RELATED APPLICATIONS

This application claims the benefit under 35 U.S.C. § 119(e) of U.S. Provisional Patent Application No. 62/092,728 filed Dec. 16, 2014 and titled "FOLDED PRINTED CIRCUIT ASSEMBLIES AND RELATED METHODS," which application is incorporated herein by reference in its entirety.

SUMMARY

Disclosed herein are various printed circuit assemblies comprising two or more printed circuit boards stacked and/or folded into desired configurations and related methods for manufacturing/assembling such printed circuit assemblies. Certain preferred embodiments and implementations relate to printed circuit board assemblies arranged in a stacked configuration with various flex regions, which may comprise flexible coupling members, coupling various rigid circuit boards, each of which may comprise at least one substrate and one or more electrical components, to one another. Such configurations may be useful for a variety of reasons, such as providing increased electrical component density within a particular three-dimensional region and/or allowing for reducing the size of the assembly due to more efficient use of surface area on the circuit boards.

In a particular example of a method for assembling a printed circuit assembly, the method may comprise obtaining a first printed circuit board and a second printed circuit board electrically coupled with the first printed circuit board using at least one flexible coupling member. The first and second printed circuit boards may both comprise rigid, printed circuit boards having a flexibility less than a flexibility of the flexible coupling member. One or both of the first printed circuit board and the second printed circuit board may comprise a plurality of electrical components, which may be positioned on one or both of two opposing surfaces of one or more of the printed circuit boards. A first adhesive layer may be applied to at least one of the first printed circuit board and the second printed circuit board and the first printed circuit board may be stacked relative to the second printed circuit board to form a stacked, printed circuit assembly. In some implementations, this stacking may be done by bending and/or folding the flexible coupling member to allow the printed circuit boards to be repositioned from a first configuration in which they extend generally in the same plane to a second configuration in which they are stacked on one another in at least substantially parallel planes.

Some implementations may further comprise securing the first printed circuit board and the second printed circuit board in the stacked assembly using the first adhesive layer. In some such implementations, the step of securing the first printed circuit board and the second printed circuit board in the stacked assembly using the adhesive layer may comprise curing the adhesive layer.

Some implementations may further comprise obtaining a third printed circuit board electrically coupled with the second printed circuit board, wherein the second printed circuit board is electrically coupled with both the first printed circuit board and the third printed circuit board, wherein the third printed circuit board comprises a rigid, printed circuit board having a flexibility less than a flexibility of the flexible coupling member, and wherein the third printed circuit board comprises a third plurality of electrical components. Some such implementations may further comprise applying a second adhesive layer to at least one of the second printed circuit board and the third printed circuit board and stacking the third printed circuit board relative to the first printed circuit board and the second printed circuit board to form the stacked, printed circuit assembly.

In some such implementations, the step of stacking the third printed circuit board relative to the first printed circuit board and the second printed circuit board may comprise rolling the third printed circuit board relative to the second printed circuit board to form a first stack and rolling the first stack relative to the third printed circuit board to form a second stack made up of each of the first printed circuit board, the second printed circuit board, and the third printed circuit board such that the first printed circuit board is positioned in between the second printed circuit board and the third printed circuit board in the printed circuit assembly.

Alternatively, in some implementations, the step of stacking the third printed circuit board relative to the first printed circuit board and the second printed circuit board comprises forming an accordion fold such that the second printed circuit board is positioned in between the first printed circuit board and the third printed circuit board in the printed circuit assembly.

Some implementations may further comprise applying an adhesive barrier to at least one of the first printed circuit board and the second printed circuit board. In some such implementations, the step of applying an adhesive barrier may be performed before the step of applying a first adhesive layer to at least one of the first printed circuit board and the second printed circuit board. In some implementations, the adhesive barrier may define an enclosed perimeter. Thus, in some such implementations, the step of applying a first adhesive layer to at least one of the first printed circuit board and the second printed circuit board may comprise pouring a liquid adhesive into the adhesive barrier and curing the liquid adhesive and/or allowing it to dry.

In some implementations, the step of stacking the first printed circuit board relative to the second printed circuit board to form a stacked, printed circuit assembly may be performed without using any standoffs, connectors, or solder.

In a particular example of a printed circuit assembly, the assembly may comprise a first printed circuit board and a second printed circuit board. One or both of the first and second printed circuit boards may comprise a plurality of electrical components. The assembly may further comprise a flexible coupling member coupling the first printed circuit board with the second printed circuit board. The first printed circuit board may be stacked on top of the second printed circuit board. An adhesive layer may be positioned in between the first printed circuit board and the second printed circuit board. The adhesive layer may be configured to maintain the first printed circuit board in a stacked configuration with respect to the second printed circuit board.

At least one of the first printed circuit board and the second printed circuit board may comprise a first electrical component layer on a first surface and a second electrical component layer on a second surface opposite from the first surface. In some such embodiments, electrical component layers may be positioned on both opposing surfaces of one or both of the first and second printed circuit boards.

Some embodiments may further comprise an adhesive barrier extending about a perimeter of the adhesive layer. In some such embodiments, the adhesive barrier comprises a material configured to absorb electromagnetic radiation such that the adhesive barrier and/or the printed circuit boards are configured to serve, at least in part, as a Faraday cage with respect to electrical components positioned within the adhesive barrier.

Some embodiments may further comprise a third printed circuit board comprising a third plurality of electrical components. The third printed circuit board may be stacked on top of the first and second printed circuit boards or elsewhere within a vertical stack comprising the other printed circuit boards. Some such embodiments may further comprise a second flexible coupling member coupling the third printed circuit board with at least one of the second printed circuit board and the third printed circuit board.

In some embodiments, the printed circuit assembly may lack any standoffs or fasteners for coupling the first printed circuit board with the second printed circuit board.

In another specific example of a printed circuit assembly for an inertial navigation system, the system may comprise a first printed circuit board comprising a substrate; a first component layer comprising a first plurality of inertial navigation electrical components; and a second component layer comprising a second plurality of inertial navigation electrical components. In some embodiments, the first component layer may be positioned on a first surface of the substrate, and the second component layer may be positioned on a second surface of the substrate opposite from the first surface.

The system may further comprise a second printed circuit board comprising a substrate; and a first component layer comprising a first plurality of inertial navigation electrical components. In some embodiments, the second printed circuit board may further comprise a second component layer. In some such embodiments, the second component layer may be positioned on a surface of the second printed circuit board opposite from the first component layer.

The system may further comprise a flexible coupling member coupling the first printed circuit board with the second printed circuit board. The first printed circuit board may be stacked on top of the second printed circuit board such that at least one of the first and second component layers of the first printed circuit board is positioned immediately adjacent to the first component layer of the second printed circuit board. An adhesive barrier may be positioned in between the first printed circuit board and the second printed circuit board. In some embodiments, the adhesive barrier may define a perimeter for receiving a liquid adhesive. An adhesive, such as a liquid adhesive prior to drying/curing, may be positioned within the adhesive barrier for maintaining the first printed circuit board in a stacked configuration with respect to the second printed circuit board.

In some embodiments, the adhesive barrier may comprise a material configured to absorb electromagnetic radiation such that the adhesive barrier and/or the printed circuit boards are configured to serve, at least in part as a Faraday cage with respect to electrical components positioned within the perimeter of the adhesive barrier.

In some embodiments, the printed circuit assembly may lack any structure for coupling the first printed circuit board with the second printed circuit board other than the adhesive and the flexible coupling member.

In some embodiments, the second printed circuit board may further comprise a second component layer comprising a second plurality of inertial navigation electrical components. In some such embodiments, the first component layer of the second printed circuit board may be positioned on a first surface of the substrate of the second printed circuit board, and the second component layer of the second printed circuit board may be positioned on a second surface of the substrate of the second printed circuit board opposite from the first surface of the second printed circuit board.

The features, structures, steps, or characteristics disclosed herein in connection with one embodiment may be combined in any suitable manner in one or more alternative embodiments.

BRIEF DESCRIPTION OF THE DRAWINGS

The written disclosure herein describes illustrative embodiments that are non-limiting and non-exhaustive. Reference is made to certain of such illustrative embodiments that are depicted in the figures, in which:

FIGS. 2A-2D depict various stages of a process for assembling two printed circuit boards into a stacked configuration according to certain preferred implementations.

FIGS. 4A-4D depict various stages of a process for assembling three printed circuit boards into a stacked configuration according to certain preferred implementations.

DETAILED DESCRIPTION

Figure 1:
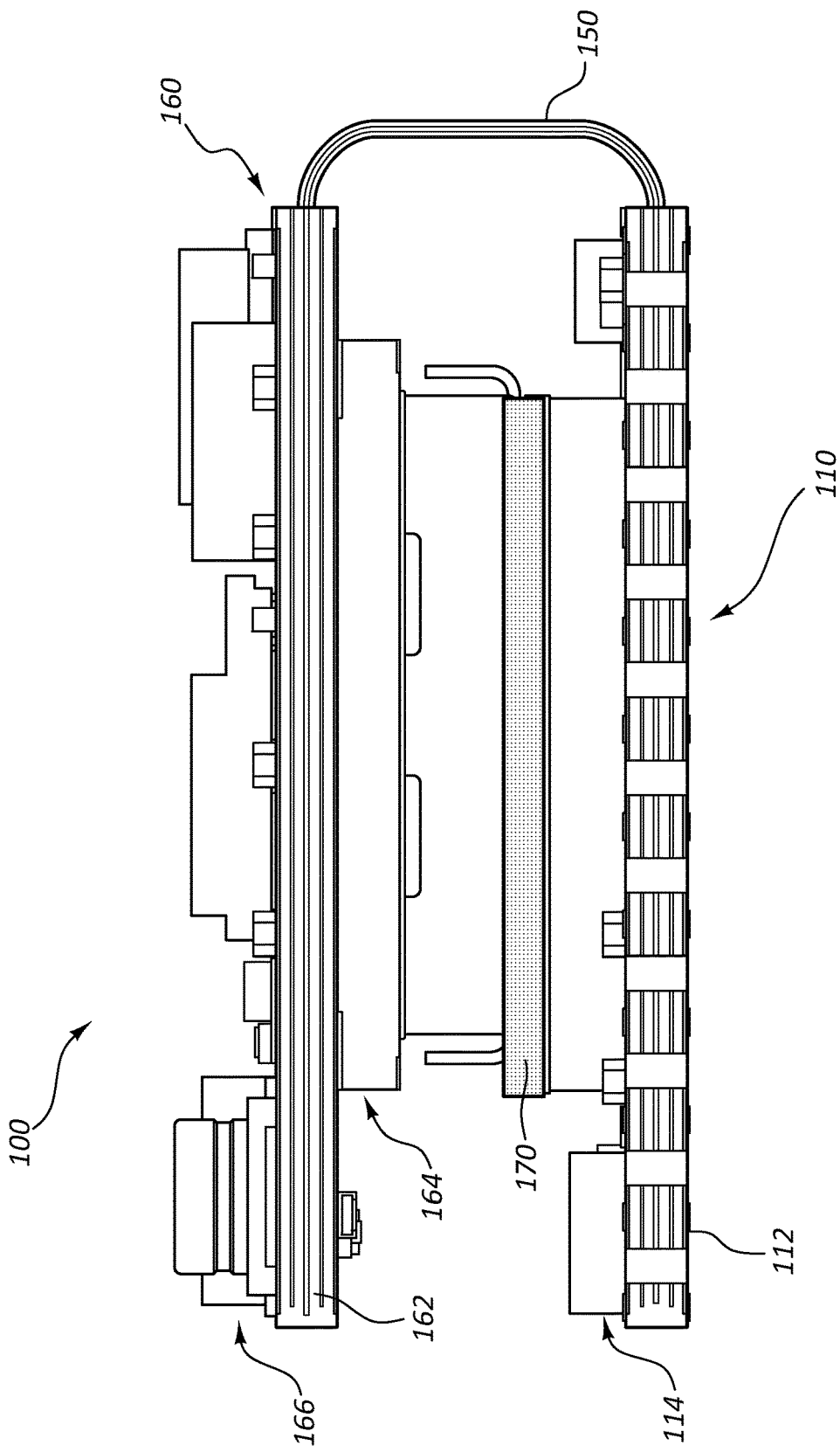
FIG. 1 is a side elevation view of an embodiment of a printed circuit assembly comprising two printed circuit boards.

A detailed description of apparatus, systems, and methods consistent with various embodiments of the present disclosure is provided below. It will be readily understood that the components of the present disclosure, as generally described and illustrated in the drawings herein, could be arranged and designed in a wide variety of different configurations. Thus, the following more detailed description of the embodiments of the apparatus is not intended to limit the scope of the disclosure, but is merely representative of possible embodiments of the disclosure. In addition, while numerous specific details are set forth in the following description in order to provide a thorough understanding of the embodiments disclosed herein, some embodiments can be practiced without some or all of these details. Moreover, for the purpose of clarity, certain technical materials, structures, or operations that are known in the related art have not been shown or described in detail in order to avoid unnecessarily obscuring the disclosure.

Various embodiments of apparatus, methods, and systems are disclosed herein that relate to circuit board assemblies. More particularly, certain preferred embodiments relate to printed circuit board assemblies arranged in a stacked configuration with various flex regions, which may comprise flexible coupling members, coupling various rigid circuit boards to one another. Such configurations may be useful for a variety of reasons. For example, they may allow for providing increased electrical component density within a particular three-dimensional region.

Additional details regarding certain preferred embodiments will now be described in greater detail with reference to the accompanying drawings. FIG. 1 depicts a side elevation view of an embodiment of a printed circuit assembly 100. Printed circuit assembly 100 comprises a first printed circuit board 110 and a second printed circuit board 160 coupled with a flex region, which may comprise a flexible coupling member 150. In some embodiments, one or both of printed circuit boards 110 and 160 may comprise a layered printed circuit board, such as, for example, a printed circuit board comprising two external surfaces and four internal layers.

Flexible coupling member 150 may be configured to both mechanically and electrically couple first printed circuit board 110 with second printed circuit board 160. Thus, flexible coupling member 150 may comprise a flexible material, such as polyimide, PEEK, or a conductive polyester film. Flexible coupling member 150 may further comprise one or more leads, wires, or other conductive regions that allow for transmission of electrical signals between first printed circuit board 110 and second printed circuit board 160. In some embodiments, flexible coupling member 150 may comprise a flexible printed circuit configured for electrically coupling first printed circuit board 110 with second printed circuit board 160.

In some embodiments, flexible coupling member 150 may comprise a non-resilient, flexible material such that it can be flexed to allow for folding first printed circuit board 110 and second printed circuit board 160 into a desired folded/stacked configuration, as discussed in greater detail below, without generating a force, or while only generating a minimal force that tends to separate the two printed circuit boards. In other words, resiliently flexible materials that tend to return to their original shape after being flexed may not be suitable for certain embodiments and implementations disclosed herein.

In certain preferred embodiments, flexible coupling member 150 may be integrally designed as part of the assembly coupling first printed circuit board 110 with second printed circuit board 160. In other words, printed circuit assembly 100 may be configured without any electrical connectors for coupling first printed circuit board 110, flexible coupling member 150, and/or second printed circuit board 160. Configuring the printed circuit assembly 100 in this manner may allow for an assembly that conserves space and/or fits within tighter confines than existing designs.

First printed circuit board 110 comprises a substrate 112 and a component layer 114. Substrate 112 may comprise one or more substrate layers. For example, in some embodiments, substrate 112 may comprise several copper layers making up a multi-layered, printed circuit board. However, substrate 112 may only comprise a single external surface for receiving electrical components, or, in alternative embodiments, may comprise two opposing, external surface layers for receiving such components. Substrate 112 may comprise, for example, any standard, hybrid, or similar glass fiber or fabric epoxy laminate such as FR4, CEM-3, Rogers™, Arlon™, Park-Nelco™, or Getek™ circuit boards.

Component layer 114 may comprise any of a wide variety of known electrical components, such as capacitors, inductors, antennas, resistors, sensors, microprocessors, integrated circuits, etc. In some more particular embodiments, printed circuit assembly 100 may comprise a printed circuit assembly for an inertial navigation system. In some such embodiments, component layer 114 may therefore comprise various suitable components, such as gyros, accelerometers, magnetometers, barometric pressure sensors, and the like.

Second printed circuit board 160 may similarly comprise a substrate 162. Like substrate 112, substrate 162 may comprise one or more substrate layers. For example, in some embodiments, substrate 162 may comprise several copper layers making up a multi-layered, printed circuit board. However, substrate 162 may comprise two opposing surfaces configured for receiving electrical components. Thus, unlike first printed circuit board 110, second printed circuit board 160 may comprise a first component layer 164 and a second component layer 166. Second component layer 166 may be positioned on a surface of substrate 162 opposite from the layer upon which first component layer 164 is positioned. Component layers 164 and 166 may, like component layer 114, comprise any of a wide variety of known electrical components, such as capacitors, inductors, antennas, resistors, sensors, microprocessors, integrated circuits, etc.

Although the embodiment depicted in FIG. 1 only includes a single component layer 114 on substrate 112, alternative embodiments are contemplated in which, like substrate 162, substrate 112 may comprise two separate component layers positioned on opposing surfaces of substrate 112. In some such embodiments, contact fingers or other electrical coupling means may be positioned elsewhere on printed circuit assembly 100, such as along one or more edges of one or more of the substrates, which may facilitate electrically coupling the device to other printed circuit boards, assemblies, switches, or devices. However, in certain preferred embodiments, printed circuit assembly 100 may be configured without any standoffs or fasteners configured to couple the assembly to another structure, such as an enclosure, case, board, or other device.

In some embodiments, the only electrical coupling between adjacent printed circuit boards in the assembly may comprise one or more flexible coupling members 150 that may extend from an edge of one printed circuit board and flex or bend to mate with an edge of an adjacent printed circuit board such that no surface area on either of the stacked printed circuit boards is used to accomplish this coupling. Moreover, by using an adhesive, no such surface area is needed to accomplish either electrical or physical coupling between the printed circuit boards of the assembly.

Printed circuit assembly 100 may further comprise one or more adhesive layers 170, which may be used to firmly adhere first printed circuit board 110 with second printed circuit board 160 in a stacked configuration. Such a configuration may be desirable for a number of reasons. For example, it may satisfy the demands of providing smaller, more compact circuit board technology, which may allow for incorporation of more sophisticated circuitry into various devices such as navigation systems, global navigation satellite systems, inertial measurement units, attitude heading reference systems, and the like. In addition, such embodiments may allow for increasing the number of component layers per two dimensional area and thereby providing a higher component density per three dimensional volume. Electromagnetic interference (EMI) isolation benefits may also be provided in certain embodiments because one or more of the folded/stacked printed circuit boards may replace need for additional metallic shielding and/or a case for EMI isolation. Moreover, various embodiments disclosed herein may beneficially obscure/encapsulate sensitive technology.

Adhesive layer 170 may comprise, for example, transfer tapes, such as VHB™, thixotropic pastes or glues, such as epoxy resin glues, potting compounds, plastics, or the like. In embodiments comprising a thin transfer tape, such tape may be applied to the top surfaces of some, or all, of electrical components on component layers 114 and 164. In embodiments comprising a thick transfer tape or VHB™ tape, the tape may be applied to the top and edge surfaces of some, or all, of electrical components on component layers 114 and 164. In embodiments comprising a liquid adhesive, such as a plastic or glue, the adhesive may be applied not only to the top surface of some or all of the electrical components on component layers 114 and 164, it may also be applied to other exposed surfaces, such as side surfaces of such components and/or the opposing surfaces of substrates 112 and 162. Thus, in some such embodiments, the printed circuit assembly 100 may be fully encapsulated by adhesive material. In still other embodiments, a high-temperature adhesive may be used, which may allow a customer to reflow the adhesive during a subsequent manufacturing process.

Figure 2A:
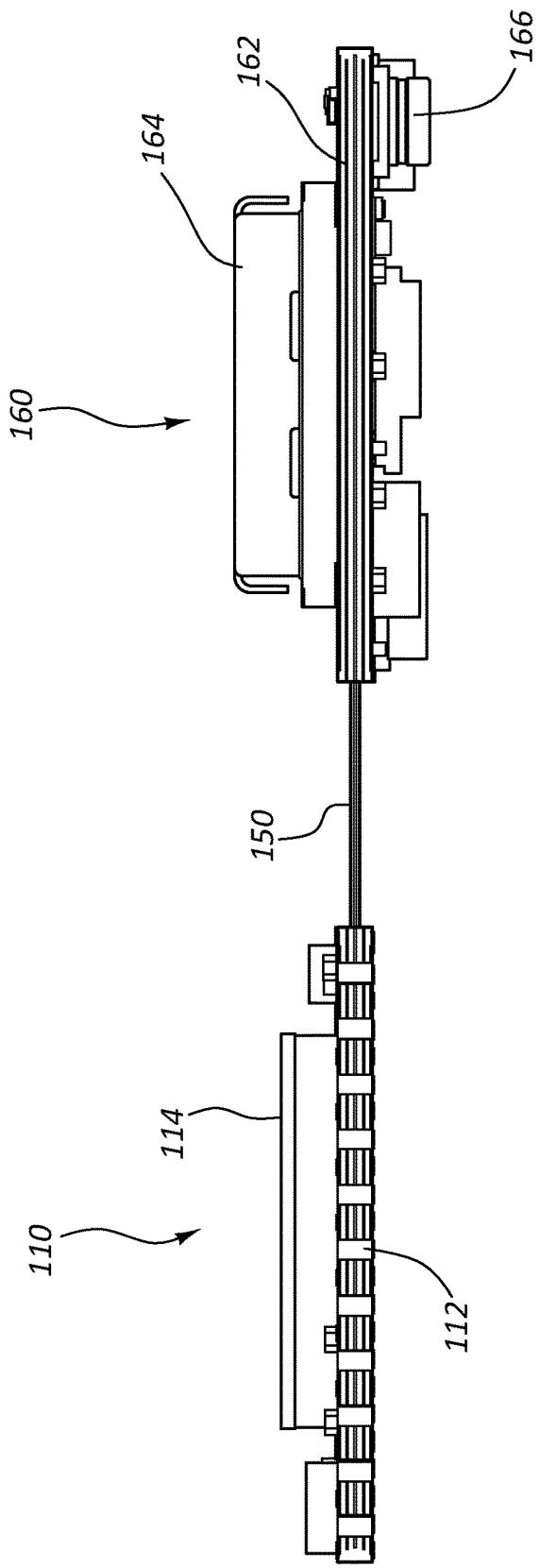

FIGS. 2A-2D depict various stages of a process for assembling first printed circuit board 110 and second printed circuit board 160 into a desired folded/stacked configuration according to certain preferred implementations. As shown in FIG. 2A, first printed circuit board 110 is initially coupled with second printed circuit board 160 by integrally coupling flexible coupling member 150 with opposing lateral edges of first printed circuit board 110 and second printed circuit board 160, respectively. Preferably, first printed circuit board 110 is positioned adjacent to second printed circuit board 160 with their respective component layers 114 and 164 facing the same direction, as shown in FIG. 2A. As also shown in this figure, one (or, in other embodiments, both) of the printed circuit boards 160 may comprise a second component layer 166 facing in the opposite direction. An adhesive layer (not shown in FIGS. 2A-2D) may also be added to one or both of first printed circuit board 110 and second printed circuit board 160 at the stage depicted in FIG. 2A if desired.

Figure 2D:
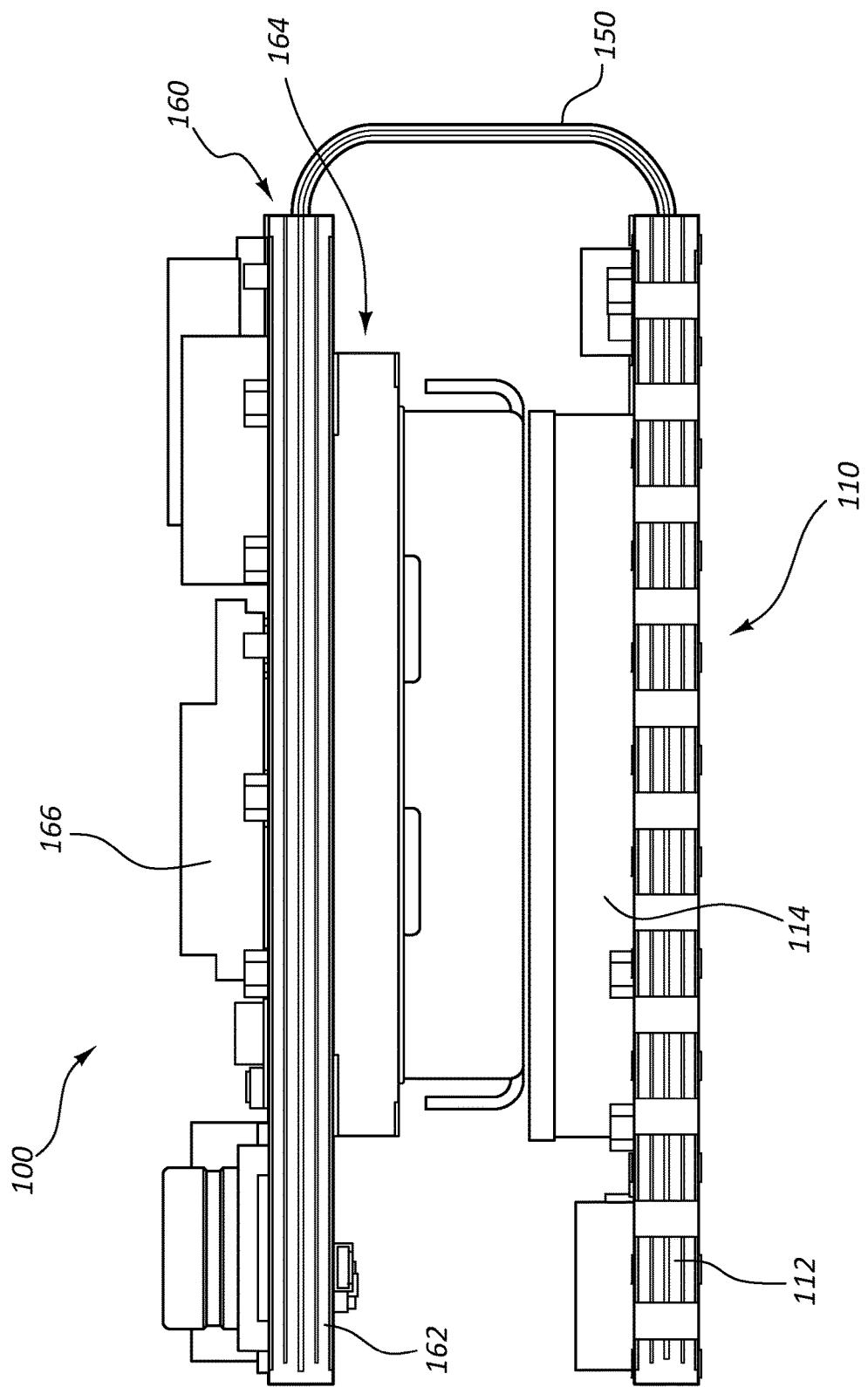

As shown in FIGS. 2B and 2C, the two adjacent printed circuit boards 110 and 160 may then be folded by bending flexible coupling member 150 such that the two printed circuit boards are positioned on top of one another in a stacked configuration. In certain preferred implementations, the folding process may continue until one or more surfaces on component layer 114 have come into contact with one or more surfaces on component layer 164, as shown in FIG. 2D. In some embodiments, as previously mentioned, an adhesive layer may be positioned in between component layer 114 and component layer 164 to facilitate such contact and prevent the two printed circuit boards from being removed from one another.

Figure 3:
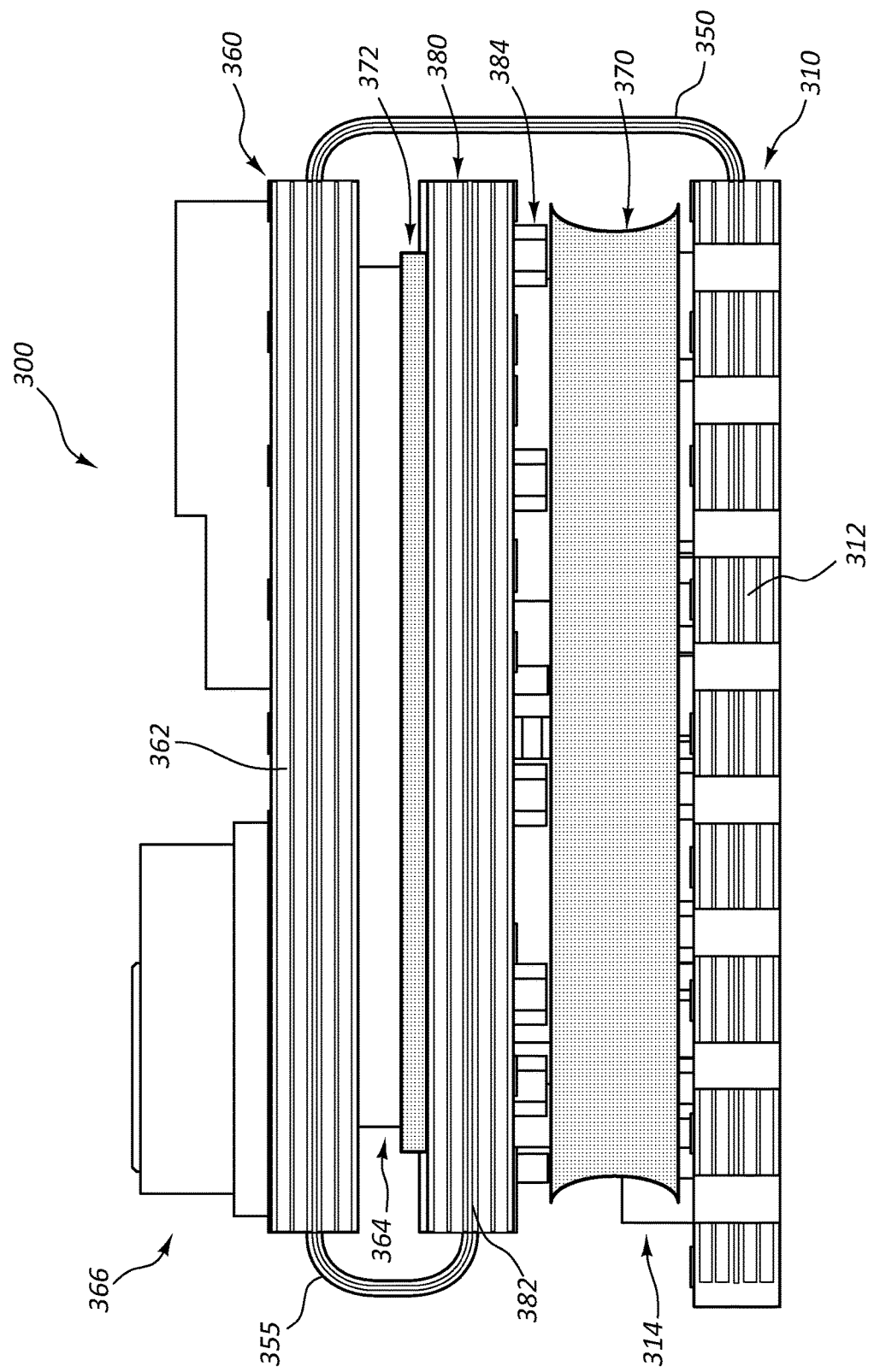
FIG. 3 is a side elevation view of an embodiment of a printed circuit assembly comprising three printed circuit boards.

FIG. 3 depicts a side elevation view of another embodiment of a printed circuit assembly 300. Printed circuit assembly 300 comprises three printed circuit boards, namely, first printed circuit board 310, second printed circuit board 360, and third printed circuit board 380. Each of the various printed circuit boards are coupled with one another, both physically and electrically, via flex regions that may comprise flexible coupling members. More particularly, printed circuit board 310 is coupled with printed circuit board 360 via flexible coupling member 350 and printed circuit board 360 is coupled with printed circuit board 380 via flexible coupling member 355.

As with printed circuit assembly 100, each of the various printed circuit boards may comprise a substrate layer and either one component layer or two opposing component layers, each of which may comprise a plurality of electrical components. Thus, printed circuit board 310 comprises a substrate 312 and a component layer 314. Similarly, printed circuit board 360 comprises a substrate 362, a first component layer 364, and a second component layer 366. Second component layer 366 may be positioned on a surface of substrate 362 opposite from the surface upon which first component layer 364 is positioned. Finally, printed circuit board 380 comprises a substrate 382 and a component layer 384. However, in alternative embodiments, printed circuit board 380 may comprise two opposing component layers, similar to printed circuit board 360.

Still, as shown in the depicted embodiment, it might be preferable for some embodiments to comprise a component layer coupled to a bare circuit board surface without electrical components. This may be useful, for example, to accomplish certain EMI isolation objectives and/or to improve the manufacturability of the assembly. In some embodiments, one or more of the layers may not comprise any electrical components in between substrates. Instead, a circuit board surface may be adhered directly to another circuit board surface without any intervening electrical components if desired.

As previously mentioned, each of the various substrates may comprise one or more substrate layers. Moreover, like printed circuit assembly 100, in certain preferred embodiments, printed circuit assembly 300 may be configured without any standoffs or fasteners configured to couple the assembly to another structure, such as an enclosure, case, board, or other device. In some embodiments, one or more of the various printed circuit assemblies disclosed herein may also, or alternatively, be configured without any standoffs or fasteners configured to couple the adjacent printed circuit boards to one another.

Printed circuit assembly 300 may further comprise one or more adhesive layers, which may be used to firmly adhere the various printed circuit boards in a stacked configuration. More particularly, printed circuit assembly 300 comprises a first adhesive layer 370 positioned in between printed circuit boards 310 and 380, and a second adhesive layer 372 positioned in between printed circuit boards 360 and 380. As previously mentioned, the adhesive layers may comprise, for example, VHB™ tape or another tape, thixotropic pastes or glues, such as epoxy resin glues, potting compounds, plastics, or the like. Adhesive layers 370 and 372 may comprise the same adhesive material or, alternatively, may comprise differing materials. For example, in the depicted embodiment, adhesive layer 370 may comprise a liquid bonding material, such as a glue, potting compound, or plastic material and adhesive layer 372 may comprise a thin transfer tape. It may be desirable to include different adhesive materials in the same assembly to, for example, improve re-work ability (the ability to service components after use) or reconfigure component circuitry. Because transfer tape is better suited for this purpose, it may be desirable to use, for example, transfer tape for certain layers/components of the assembly and another adhesive, such as glues or other liquid adhesives, for other layers/components not typically needed for reconfiguration/reworking.

Figure 4A:
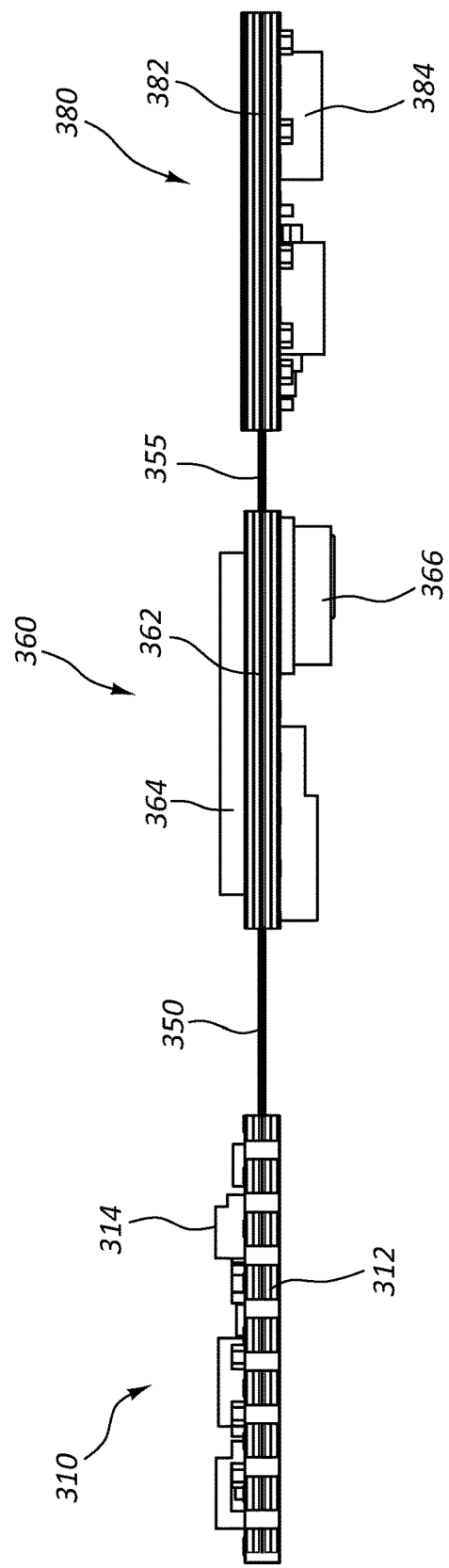

FIGS. 4A-4D depict various stages of a process for assembling printed circuit boards 310, 360, and 380 of printed circuit assembly 300 into a desired folded/stacked configuration according to certain preferred implementations. As shown in FIG. 4A, first printed circuit board 310 is initially coupled with second printed circuit board 360 by integrally coupling flexible coupling member 350 with opposing lateral edges of first printed circuit board 310 and second printed circuit board 360, respectively. Similarly, second printed circuit board 360 may be coupled with third printed circuit board 380 by integrally coupling flexible coupling member 355 with opposing lateral edges of second printed circuit board 360 and third printed circuit board 380, respectively.

Adhesive layers 370 and 372 (not shown in FIGS. 4A-4D) may also be added to one or more of the various printed circuit boards at the stage depicted in FIG. 4A if desired.

Figure 4C:
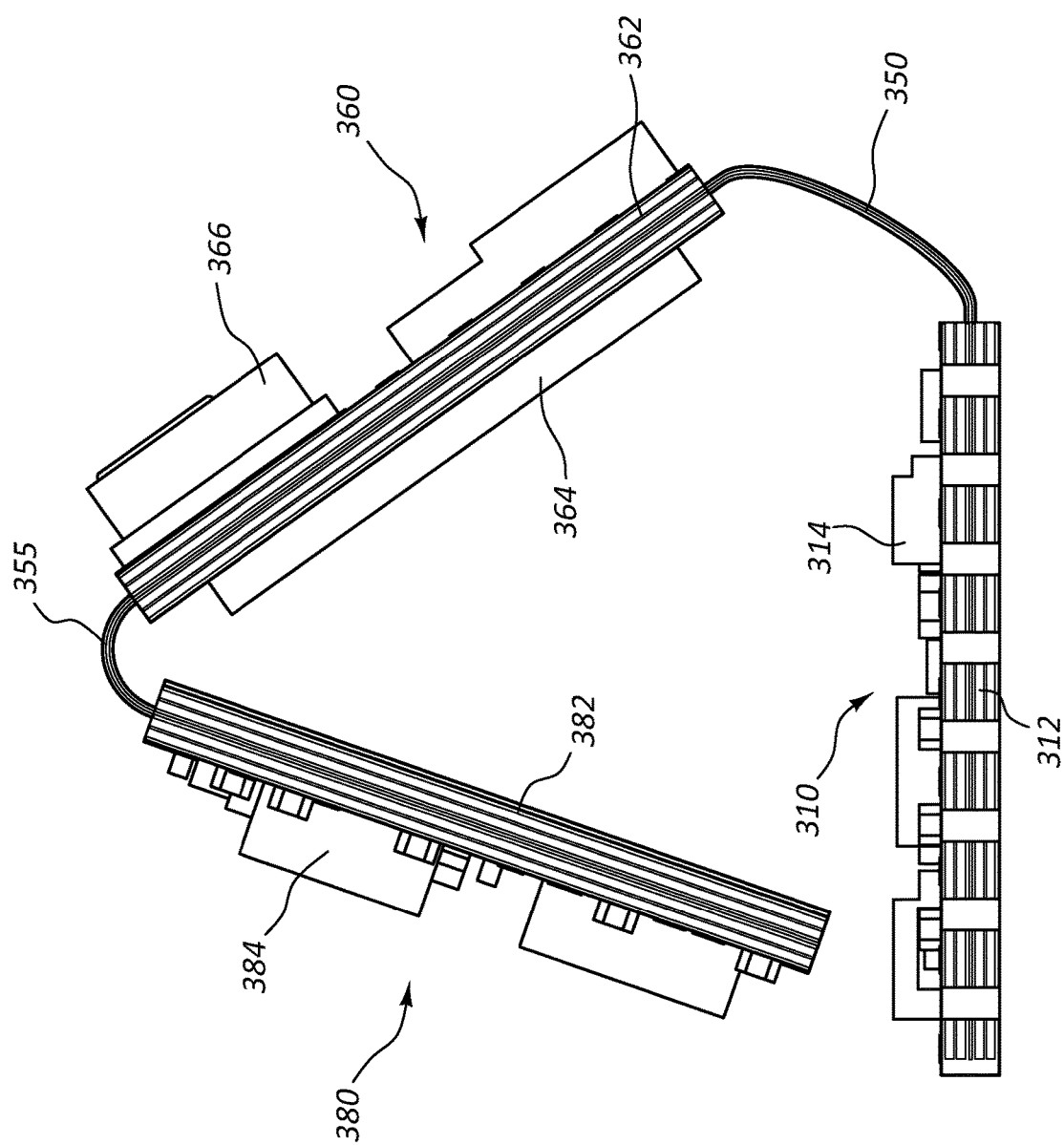

As shown in FIGS. 4B and 4C, the adjacent printed circuit boards 310, 360, and 380 may then be folded by bending flexible coupling members 350 and 355 such that the three printed circuit boards are positioned on top of one another in a stacked configuration. Printed circuit board 380 may be tucked in between printed circuit boards 310 and 360 if desired, as shown in FIG. 4C. Alternatively, flexible coupling member 355 may be bent in an opposite direction such that printed circuit board 360 is positioned in between printed circuit boards 310 and 380.

Figure 4D:
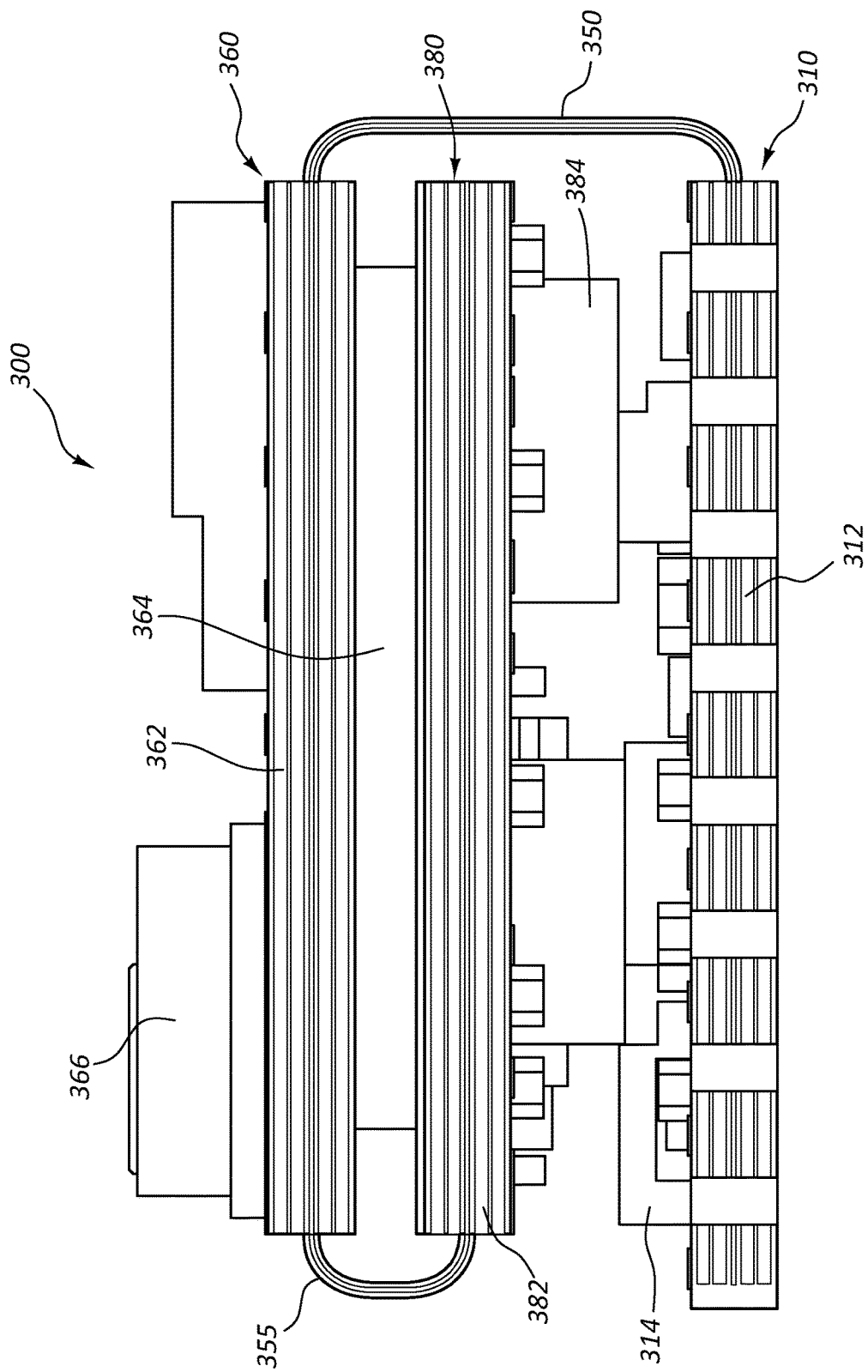

In certain preferred implementations, the folding process may continue until one or more surfaces on the component layers have come into contact with one or more surfaces on adjacent component layers and/or substrates of the various printed circuit boards, as shown in FIG. 4D.

Figure 5A:
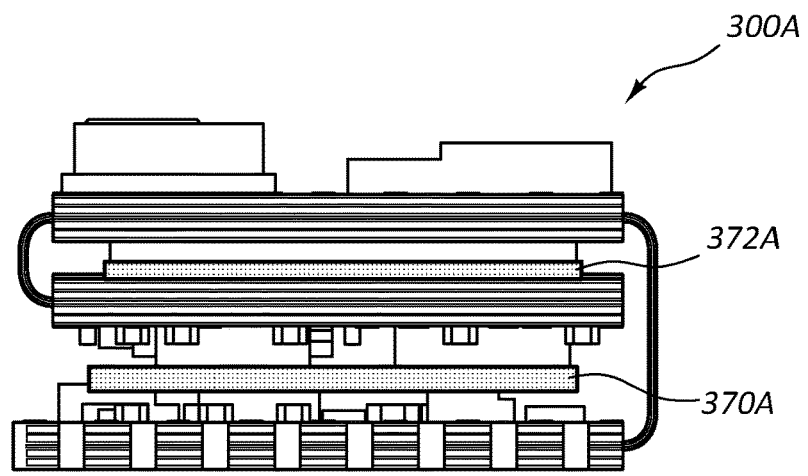
FIG. 5A depicts an alternative embodiment of a printed circuit assembly comprising three printed circuit boards.
Figure 5B:
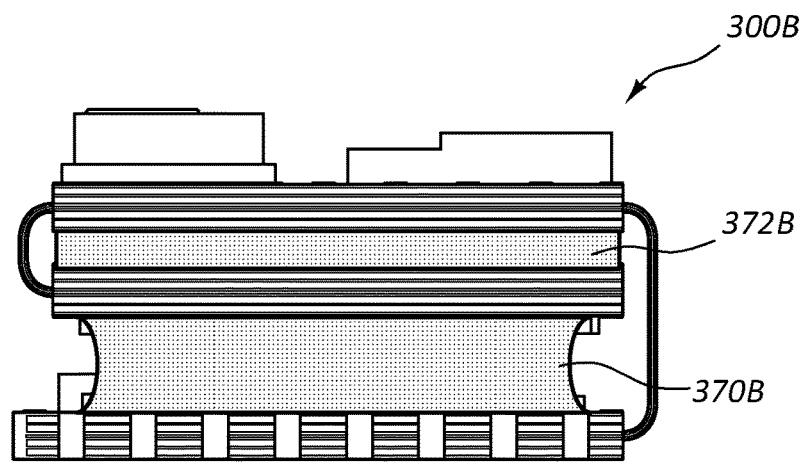
FIG. 5B depicts another alternative embodiment of a printed circuit assembly comprising three printed circuit boards.
Figure 5C:
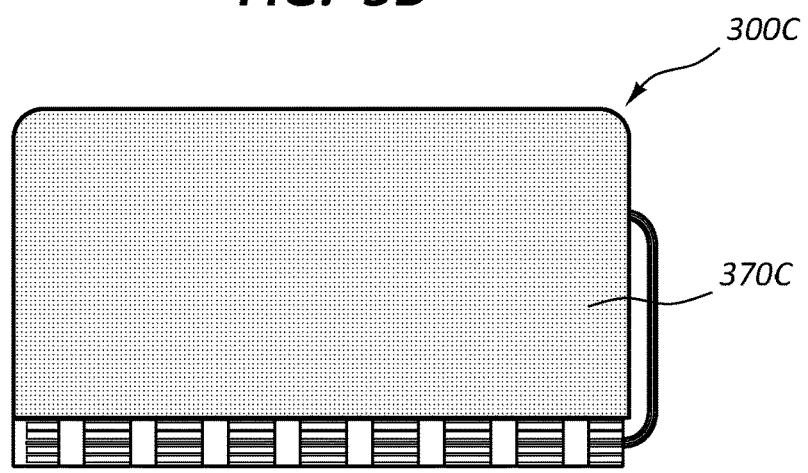
FIG. 5C depicts still another alternative embodiment of a printed circuit assembly comprising three printed circuit boards.

FIGS. 5A-5C depict various alternative embodiments similar to the printed circuit assembly 300 of FIG. 3. These embodiments differ in terms of the types of adhesives that are used in the adhesive layers. The various elements, aside from the adhesive layers in these figures, may be identical to the printed circuit assembly 300 and will therefore not be described in detail again. Printed circuit assembly 300A in FIG. 5A comprises a first adhesive layer 370A and a second adhesive layer 372A. First adhesive layer 370A may comprise a thin transfer tape and second adhesive layer 372A may comprise a thick transfer tape, such as VHB™ tape. Printed circuit assembly 300A may, for example, be best suited for use in connection with products that may need reworking for many, or all, of the electrical components of the assembly.

FIG. 5B depicts an alternative embodiment of a printed circuit assembly 300B comprising a first adhesive layer 370B and a second adhesive layer 372B. First adhesive layer 370B and second adhesive layer 372B may both comprise a liquid adhesive, such as a glue, potting compound, or plastic adhesive. However, adhesive layers 370B and 372B are applied so as to encapsulate the component layer(s) between adjacent printed circuit boards. In alternative embodiments, one of the adhesive layers may be applied solely, or at least primarily, to one or more top surfaces of one or more adjacent component layers and the other adhesive layer may be applied also to the substrate or substrates of the adjacent printed circuit boards and/or so as to encapsulate the component layer(s) between adjacent printed circuit boards. Printed circuit assembly 300B may be best suited for use in connection with products that may not typically need reworking, or may only need reworking for a subset of the electrical components. In embodiments in which only a subset of components are likely to need reworking, a suitable combination of reworkable and non-reworkable adhesives, such as tapes and liquid adhesives, respectively, may be used.

FIG. 5C depicts still another alternative embodiment of a printed circuit assembly 300C comprising an adhesive 370C. Adhesive 370C may comprise a liquid adhesive, such as a glue, potting compound, or plastic adhesive. In addition, adhesive 370C may be applied so as to encapsulate the entire printed circuit assembly 300C above a substrate of the bottom printed circuit board of the assembly, including all components and component layers between adjacent printed circuit boards. In some embodiments, adhesive 370C may therefore comprise several adhesive layers (not visible in FIG. 5C) that are positioned in between adjacent printed circuit boards, along with one or more external layers positioned along the sides of printed circuit assembly 300C, as depicted in FIG. 5C. Printed circuit assembly 300B may be best suited for use in connection with products that require waterproofing and/or electrostatic discharge (ESD) protection.

Although various specific embodiments are disclosed herein for purposes of illustration, those of ordinary skill in the art will appreciate that alternative embodiments are possible. For example, although bi-fold and tri-fold embodiments are depicted in the drawings, other embodiments may comprise any number of folds and stacked elements as desired. Moreover, still other embodiments are contemplated in which the fold pattern and/or process may vary. For example, in some embodiments, an accordion fold may be used wherein each adjacent printed circuit board in the assembly other than the top and bottom printed circuit boards is coupled with an adjacent printed circuit board along one side/edge and with another adjacent printed circuit board along an opposite side/edge to provide an accordion-fold configuration.

Figure 6:
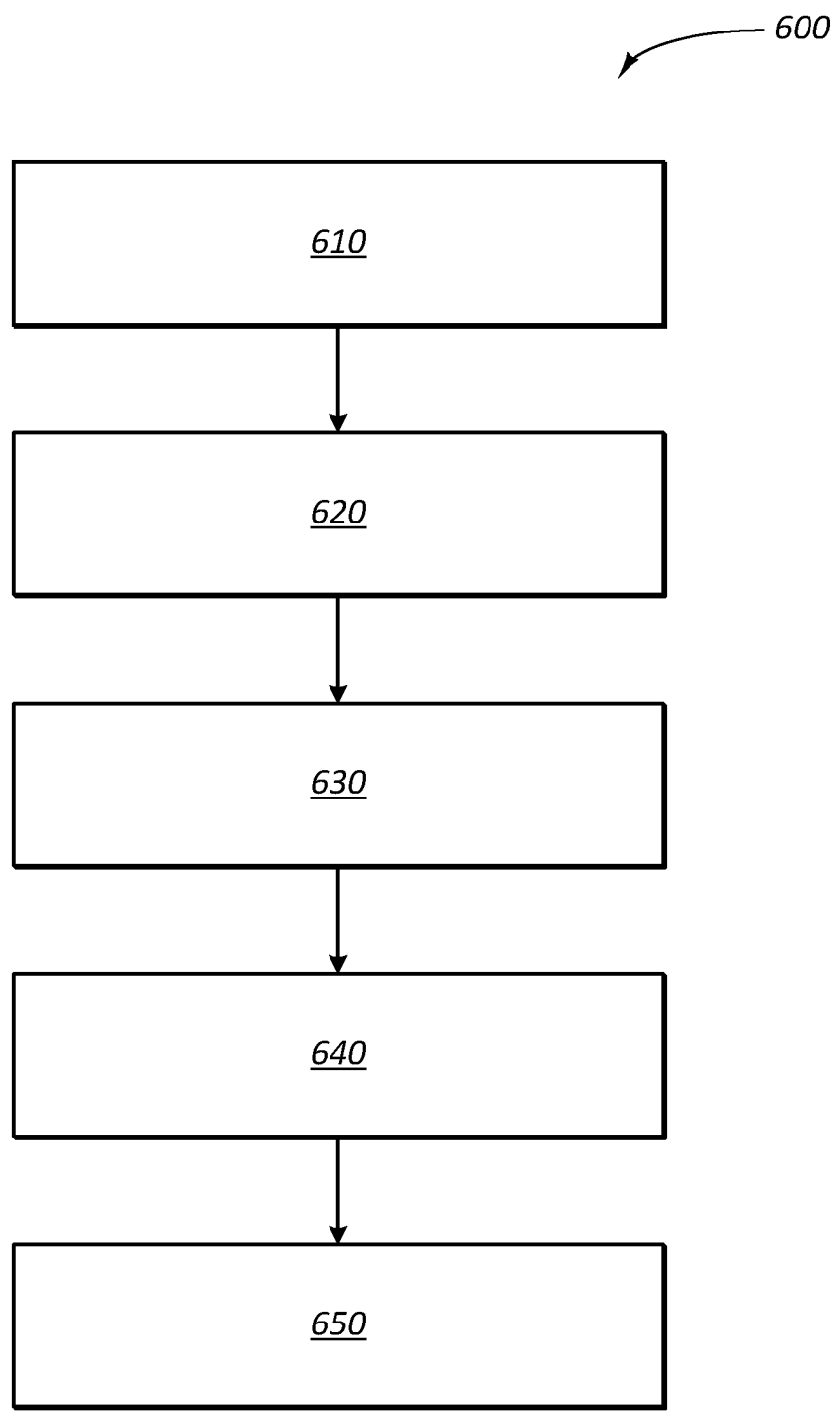
FIG. 6 is a flow chart of a method for assembling a printed circuit assembly according to some implementations.

An example of one implementation of a process 600 for assembling a printed circuit assembly is depicted in the flow chart of FIG. 6. Process 600 may begin with step 610, at which point a plurality of rigid, printed circuit boards may be coupled with at least one flexible coupling member positioned between and coupling each adjacent circuit board. In some implementations, the plurality of printed circuit boards may be arranged in an edge-to-edge arrangement with opposing bottom and top surfaces facing in directions at least substantially perpendicular to the axis of the plurality of printed circuit boards, as depicted in FIGS. 2A and 4A.

In some implementations, step 610 may comprise coupling the plurality of rigid, printed circuit boards with the flexible coupling members. In some such implementations, step 610 may comprise integrally coupling the flexible coupling members with opposing lateral edges of the various adjacent printed circuit boards.

Step 620 may comprise applying various electrical components onto the unfolded array of printed circuit boards while still in the manufactured panelized array. In some implementations, standard component assembly processes may be used. For example, component placement onto the boards may be accomplished using a pick and place machine or by hand, and soldering may be performed using either an industrial reflow oven or by use of a hand soldering iron. In some implementations, step 620 may further comprise performing electrical function tests to validate proper assembly of each electronic component.

Step 630 may comprise applying one or more adhesives to one or more of the printed circuit boards. In some implementations, each of the interior surfaces and/or each of the surfaces comprising an electrical component layer may be applied with an adhesive layer. In some implementations, as discussed above, one or more of the adhesives and/or adhesive layers may be configured to encapsulate one or more of the printed circuit board surfaces.

Step 640 may comprise rearranging the printed circuit boards in a stacked assembly. This may be accomplished by bending the flex regions of the various printed circuit boards until adjacent surfaces come into contact, as illustrated in FIGS. 2A-2D and FIGS. 4A-4D. In some implementations, the various printed circuit boards may be folded in a "rolled" process depicted in FIGS. 4A-4D such that the two adjacent printed circuit boards at one end of the "chain" of coupled boards are rolled in a first stacked configuration, the first stacked configuration is rolled relative to an adjacent printed circuit board to form a second stacked configuration having three printed circuit boards, and so on (assuming more than three printed circuit boards are used). Alternatively, the various printed circuit boards may be folded in an "accordion" fold such that the outermost printed circuit boards are positioned on the top and bottom of the stacked configuration. In such configurations, each adjacent printed circuit board in the assembly other than the top and bottom printed circuit boards of the assembled stack may be coupled with one adjacent printed circuit board along one side/edge and with another adjacent printed circuit board along an opposite side/edge.

Step 650 may comprise securing the folded printed circuit boards in a stacked configuration. In some implementations, step 650 may comprise pressing the various adhesive layers into adjacent surfaces, such as component layers or substrate layers for example. In some implementations, step 650 may comprise curing the adhesives and/or adhesive layers.

In some implementations, various printed circuit boards may be stacked and coupled with one another to form a completed printed circuit assembly solely using adhesives and flexible coupling members. In some embodiments, this stacking/coupling may therefore be performed without using any standoffs or other connectors. In some embodiments, this stacking/coupling may therefore be performed without using any solder or soldering steps.

Figure 7:
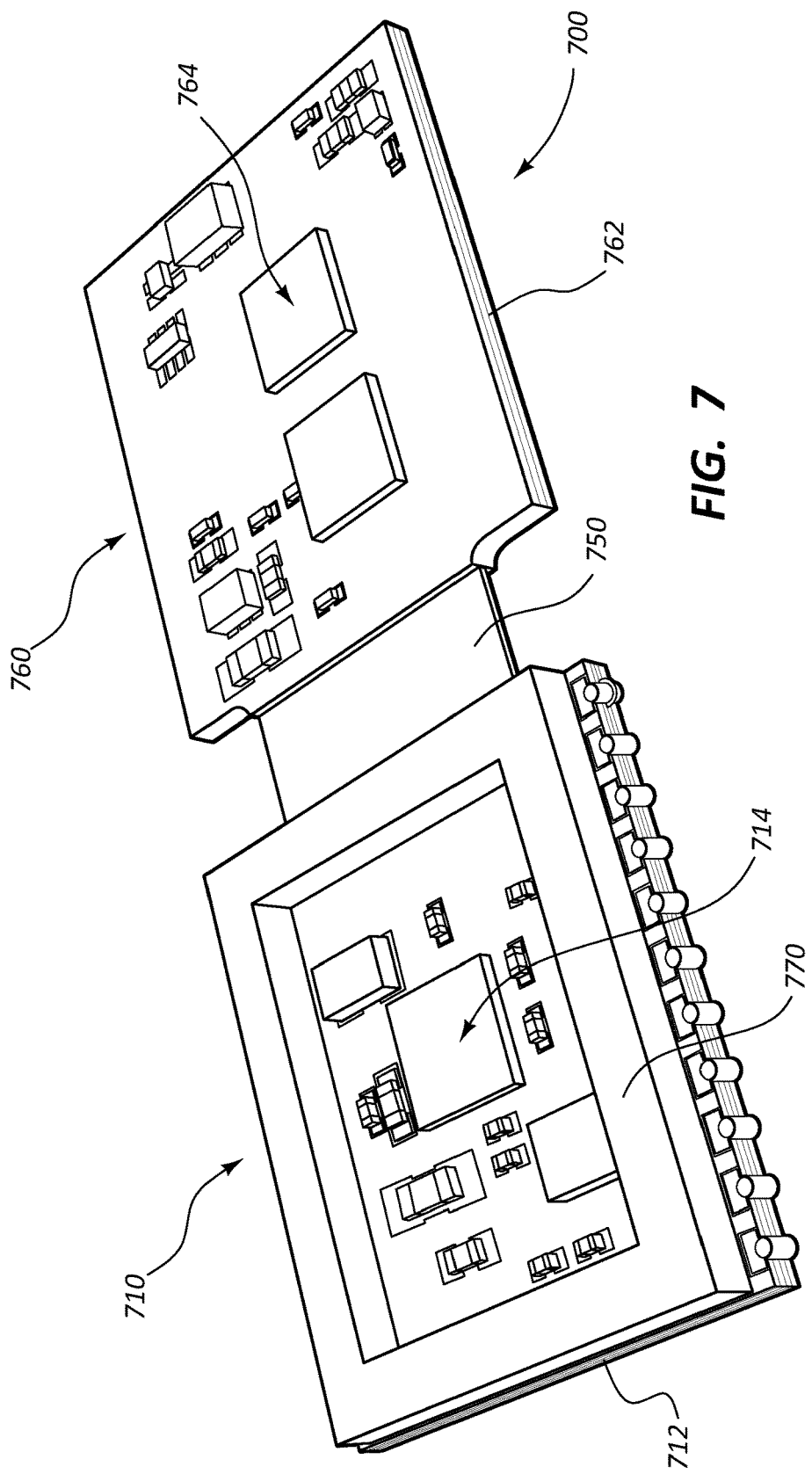
FIG. 7 is a perspective view of yet another alternative embodiment of a printed circuit assembly comprising printed circuit boards.

FIG. 7 depicts a perspective view of an alternative embodiment of a printed circuit assembly 700. Printed circuit assembly 700 comprises a first printed circuit board 710 and a second printed circuit board 760 coupled with a flex region, which may comprise a flexible coupling member 750. In some embodiments, one or both of printed circuit boards 710 and 760 may comprise a layered printed circuit board, such as, for example, a printed circuit board comprising two external surfaces and four internal layers.

In some embodiments, flexible coupling member 750 may comprise a flexible printed circuit configured for electrically coupling first printed circuit board 710 with second printed circuit board 760. In some embodiments, flexible coupling member 750 may comprise a non-resilient, flexible material such that it can be flexed to allow for folding first printed circuit board 710 and second printed circuit board 760 into a desired folded/stacked configuration, as discussed in greater detail below in connection with FIGS. 8A-8C, without generating a force tending to separate the two printed circuit boards after being stacked together, or at least only generating a minimal force tending to separate the two printed circuit boards.

Both of printed circuit boards 710 and 760 may comprise a substrate and one or more electrical components and/or component layers. For example, first printed circuit board 710 comprises a substrate 712 and a component layer 714. Substrate 712 may comprise one or more substrate layers. For example, in some embodiments, substrate 712 may comprise several copper layers making up a multi-layered, printed circuit board. However, substrate 712 may only comprise a single external surface for receiving a layer of electrical components, or, in alternative embodiments, may comprise two opposing, external surface layers for receiving such components.

Second printed circuit board 760 may similarly comprise a substrate 762 comprising one or more substrate layers. Substrate 762 comprises two opposing surfaces configured for receiving electrical components. Thus, unlike first printed circuit board 710, second printed circuit board 760 comprises a first electrical component layer 764 and a second electrical component layer 766 (see FIGS. 8A-8C). Second electrical component layer 766 is positioned on a surface of substrate 762 opposite from the surface upon which first component layer 764 is positioned. Component layers 714, 764, and 766 may comprise any of a wide variety of known electrical components, such as capacitors, inductors, antennas, resistors, sensors, microprocessors, integrated circuits, etc. In some more particular embodiments, printed circuit assembly 700 may comprise a printed circuit assembly for an inertial navigation system. In some such embodiments, one or more of component layers 714, 764, and 766 may comprise various suitable components for an inertial navigation system, such as gyros, accelerometers, magnetometers, barometric pressure sensors, and the like.

Printed circuit assembly 700 may further comprise one or more adhesive barriers, such as adhesive barrier 770, which may define a perimeter for receiving a liquid adhesive to allow the liquid adhesive to dry/cure. In some embodiments, adhesive barrier 770 may extend adjacent to a perimeter of one or both of printed circuit boards 710 and 760.

In some embodiments, the adhesive barrier may also, or alternatively, provide EMI shielding benefits. For example, in some embodiments, adhesive barrier 770 may comprise a material configured to absorb electromagnetic radiation such that the adhesive barrier is configured to serve, at least in part, as a Faraday cage with respect to electrical components positioned within a perimeter of the adhesive barrier. In some embodiments, the first printed circuit board 710 and/or the second printed circuit board 760 may alternatively, or additionally, be configured to serve as a Faraday cage. Thus, in some such embodiments, adhesive barrier 770 may comprise, for example Wave-X™ material, which is manufactured by Arc Technologies, Inc. Preferably, the material making up adhesive barrier 770 is configured to withstand solder reflow temperatures, such as temperatures up to about 300 degrees Celsius.

In embodiments in which adhesive barrier 770 defines a full perimeter, a liquid adhesive layer may be positioned within adhesive barrier 770 such that an adhesive layer of assembly 700 may be made up of adhesive barrier 770 and a cured/dried adhesive. This adhesive layer may be used to firmly adhere first printed circuit board 710 with second printed circuit board 760 in a stacked configuration.

As described above, in some embodiments, other adhesives and/or adhesive layers may be used as well. For example, in some embodiments, the adhesive layer including adhesive barrier 770 and/or another adhesive and/or adhesive layer may comprise, for example, transfer tapes, such as VHB™, thixotropic pastes or glues, such as epoxy resin glues, potting compounds, plastics, or the like, or a liquid adhesive, such as a plastic or glue.

Figure 8A:
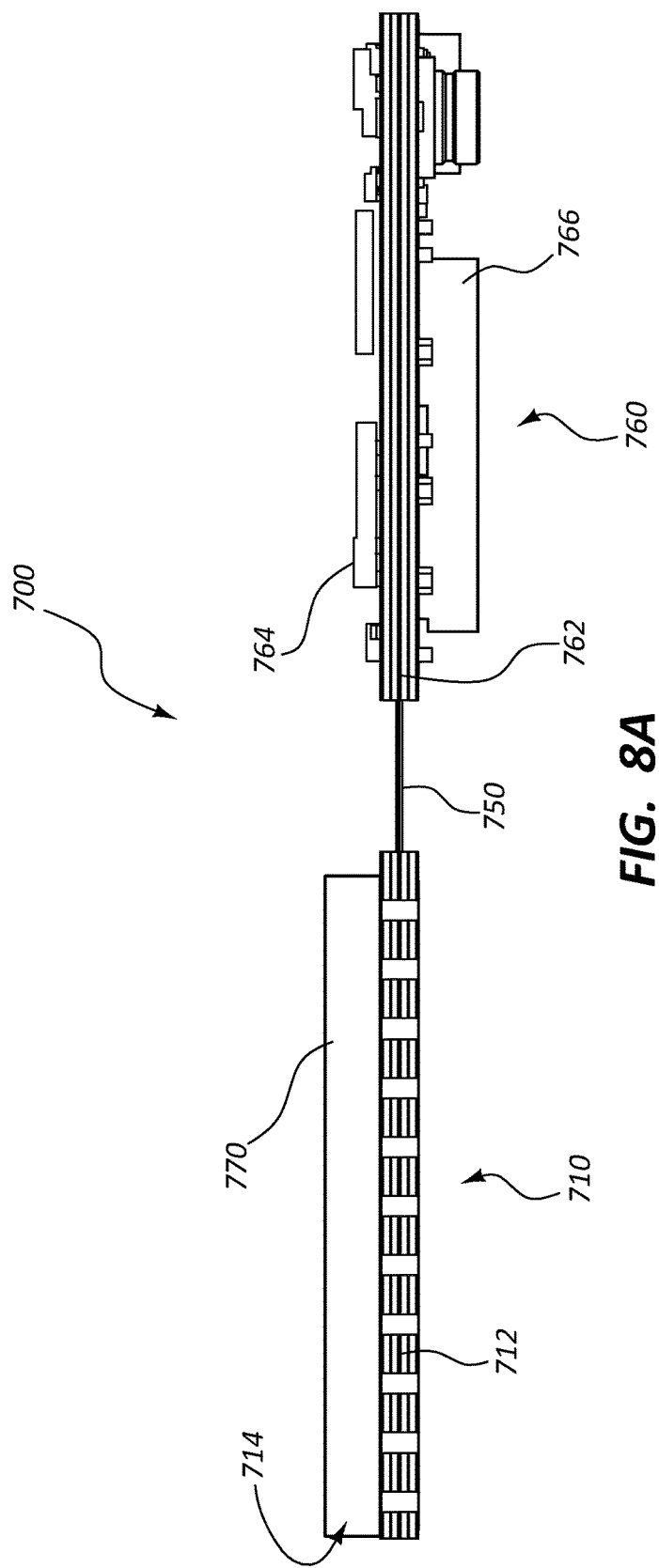
FIGS. 8A-8C depict various stages of a process for assembling the printed circuit boards of FIG. 7 into a stacked configuration according to some implementations.
Figure 8B:
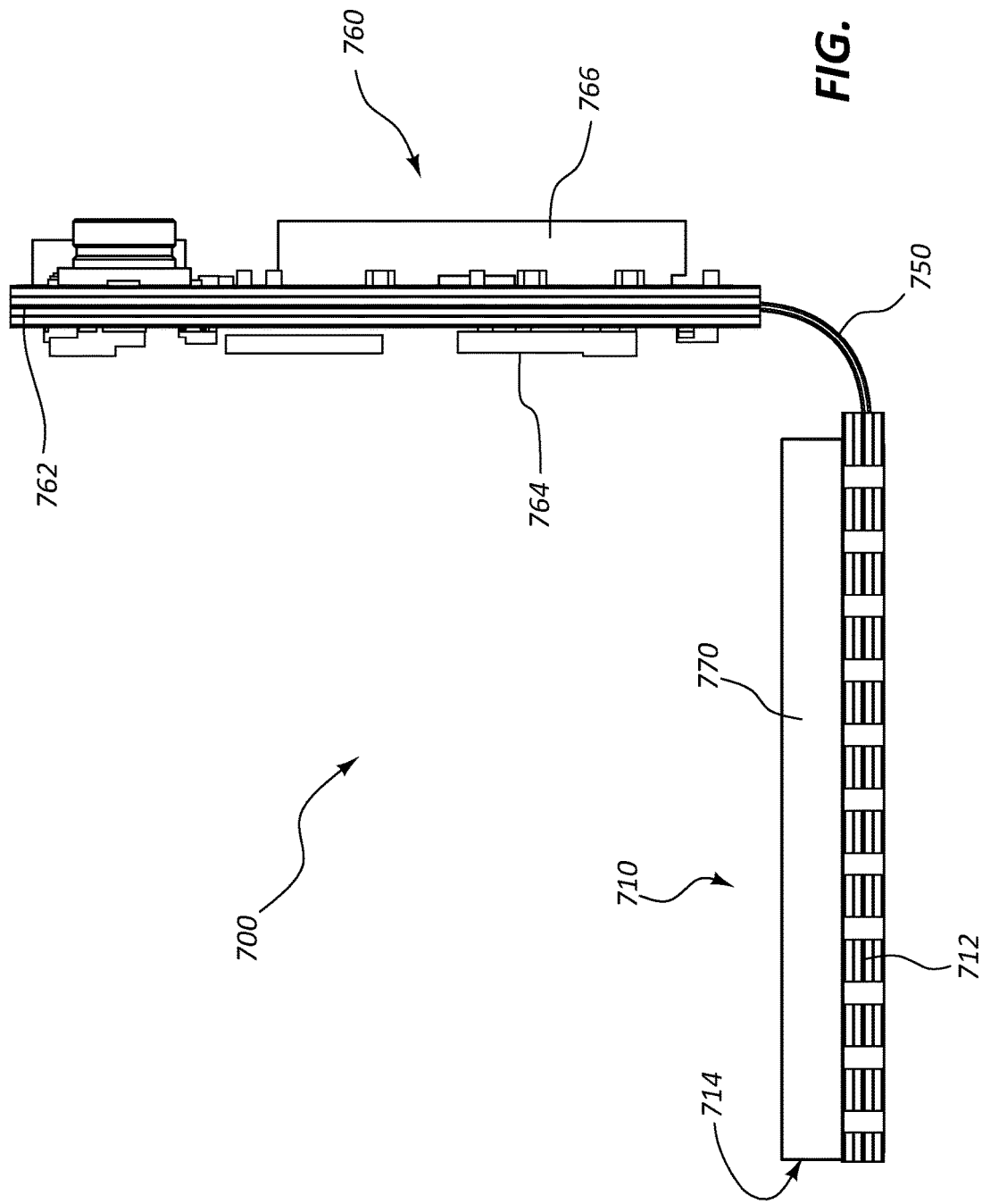
Figure 8C:
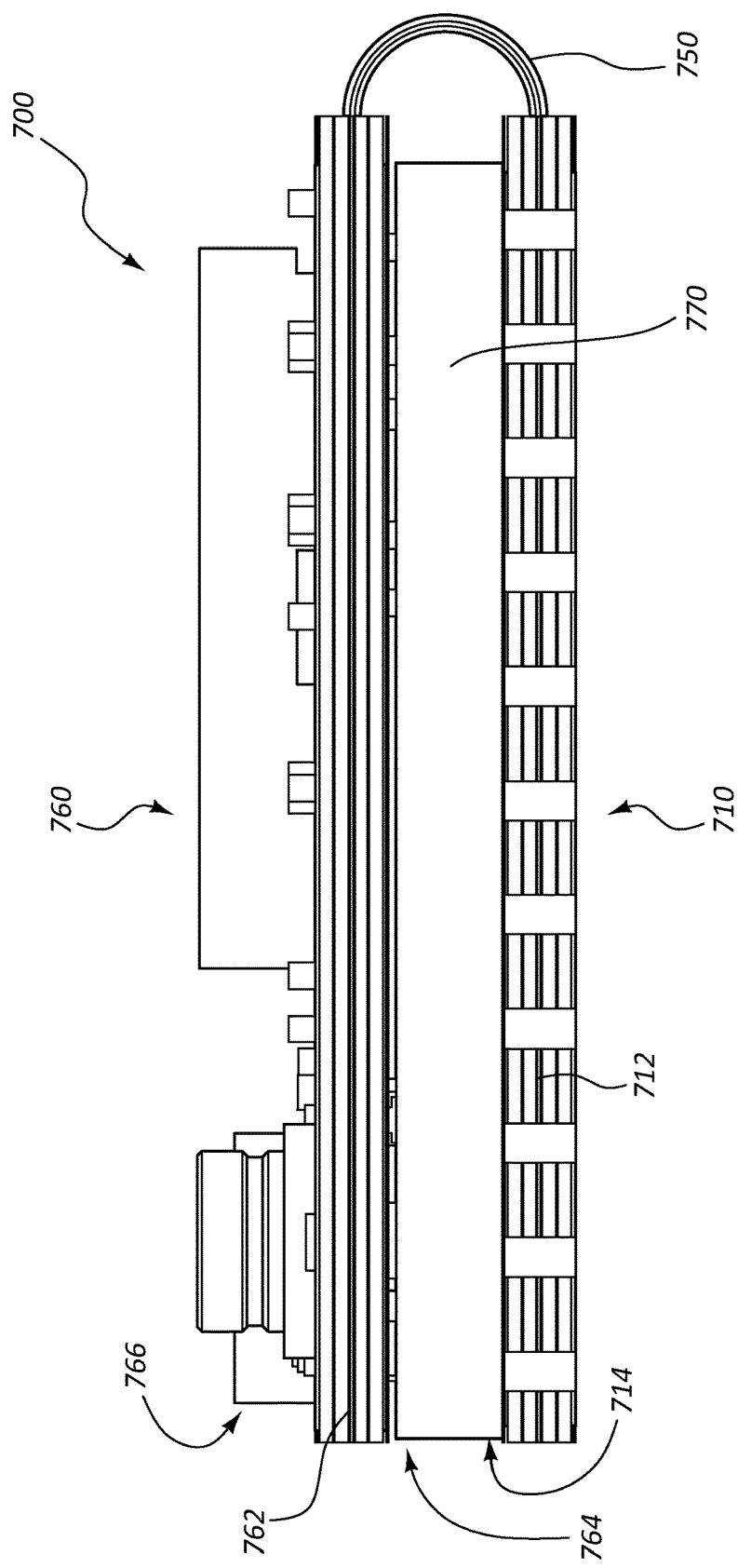

FIGS. 8A-8C depict various stages of a process for assembling first printed circuit board 710 and second printed circuit board 760 into a desired folded/stacked configuration. As shown in FIG. 8A, first printed circuit board 710 is initially coupled with second printed circuit board 760 by integrally coupling flexible coupling member 750 with opposing lateral edges of first printed circuit board 710 and second printed circuit board 760. Preferably, first printed circuit board 710 is positioned adjacent to second printed circuit board 760 with their respective component layers 714 and 764 facing the same direction, as shown in FIG. 8A. As also shown in this figure, one (or, in other embodiments, both) of the printed circuit boards, such as printed circuit board 760, may comprise a second component layer 766 facing in the opposite direction. An adhesive layer may also be added to one or both of first printed circuit board 710 and second printed circuit board 760 at the stage depicted in FIG. 8A if desired or, alternatively, may be added during a later stage of the process.

As shown in FIGS. 8B and 8C, the two adjacent printed circuit boards 710 and 760 may then be folded by bending flexible coupling member 750 such that the two printed circuit boards are positioned on top of one another in a stacked configuration. In certain preferred implementations, the folding process may continue until one or more surfaces on component layer 714 have come into contact with one or more surfaces on component layer 764, as shown in FIG. 8C. In some embodiments, as previously mentioned, an adhesive layer may be positioned in between component layer 714 and component layer 764 to facilitate such contact and prevent the two printed circuit boards from being removed from one another.

In embodiments comprising an adhesive layer comprising an adhesive barrier 770, at one or more of the stages depicted in FIGS. 8A-8C a liquid adhesive may be placed within the adhesive barrier 770. Following the stage depicted in FIG. 8C, such a liquid adhesive may be dried/cured to affix printed circuit board 710 with printed circuit board 760 in a completed assembly. As previously mentioned, in some embodiments, printed circuit board 710 may be coupled with printed circuit board 760 using only one or more adhesives and flexible coupling member 750. In other words, no other standoffs or other connectors may be used, which may be desirable to free up surface area on one or both of printed circuit board 710 and printed circuit board 760 for various electrical components or simply allow for manufacturing a smaller printed circuit assembly.

Any methods disclosed herein comprise one or more steps or actions for performing the described method. The method steps and/or actions may be interchanged with one another. In other words, unless a specific order of steps or actions is required for proper operation of the embodiment, the order and/or use of specific steps and/or actions may be modified.

Throughout this specification, any reference to "one embodiment," "an embodiment," or "the embodiment" means that a particular feature, structure, or characteristic described in connection with that embodiment is included in at least one embodiment. Thus, the quoted phrases, or variations thereof, as recited throughout this specification are not necessarily all referring to the same embodiment.

Similarly, it should be appreciated that in the above description of embodiments, various features are sometimes grouped together in a single embodiment, figure, or description thereof for the purpose of streamlining the disclosure. This method of disclosure, however, is not to be interpreted as reflecting an intention that any claim require more features than those expressly recited in that claim. Rather, inventive aspects lie in a combination of fewer than all features of any single foregoing disclosed embodiment. It will be apparent to those having skill in the art that changes may be made to the details of the above-described embodiments without departing from the underlying principles set forth herein.

The invention claimed is:

1. A method for assembling a printed circuit assembly, the method comprising the steps of:
    obtaining a first printed circuit board electrically coupled with a second printed circuit board along at least one flexible coupling member, wherein the first printed circuit board comprises a rigid, printed circuit board having a flexibility less than a flexibility of the flexible coupling member, wherein the second printed circuit board comprises a rigid, printed circuit board having a flexibility less than the flexibility of the flexible coupling member, wherein the first printed circuit board comprises a first plurality of electrical components, and wherein the second printed circuit board comprises a second plurality of electrical components;
    applying an adhesive barrier to at least one of the first printed circuit board and the second printed circuit board;
    applying a first adhesive layer to at least one of the first printed circuit board and the second printed circuit board, wherein the first adhesive layer forms a layer along each electrical component of the at least one of the first printed circuit board and the second printed circuit board, wherein the step of applying an adhesive barrier is performed before the step of applying a first adhesive layer to at least one of the first printed circuit board and the second printed circuit board, wherein the adhesive barrier defines an enclosed perimeter, and wherein the step of applying a first adhesive layer to at least one of the first printed circuit board and the second printed circuit board comprises pouring a liquid adhesive into the adhesive barrier; and
    stacking the first printed circuit board relative to the second printed circuit board to form a stacked, printed circuit assembly.

2. The method of claim 1, further comprising securing the first printed circuit board and the second printed circuit board in the stacked assembly using the first adhesive layer.

3. The method of claim 2, wherein the step of securing the first printed circuit board and the second printed circuit board in the stacked assembly using the adhesive layer comprises curing the adhesive layer.

4. The method of claim 1, further comprising:
    obtaining a third printed circuit board electrically coupled with the second printed circuit board, wherein the second printed circuit board is electrically coupled with both the first printed circuit board and the third printed circuit board, wherein the third printed circuit board comprises a rigid, printed circuit board having a flexibility less than a flexibility of the flexible coupling member, and wherein the third printed circuit board comprises a third plurality of electrical components;
    applying a second adhesive layer to at least one of the second printed circuit board and the third printed circuit board; and
    stacking the third printed circuit board relative to the first printed circuit board and the second printed circuit board to form the stacked, printed circuit assembly.

5. The method of claim 4, wherein the step of stacking the third printed circuit board relative to the first printed circuit board and the second printed circuit board comprises rolling the third printed circuit board relative to the second printed circuit board to form a first stack and rolling the first stack relative to the third printed circuit board to form a second stack made up of each of the first printed circuit board, the second printed circuit board, and the third printed circuit board such that the first printed circuit board is positioned in between the second printed circuit board and the third printed circuit board in the printed circuit assembly.

6. The method of claim 4, wherein the step of stacking the third printed circuit board relative to the first printed circuit board and the second printed circuit board comprises forming an accordion fold such that the second printed circuit board is positioned in between the first printed circuit board and the third printed circuit board in the printed circuit assembly.

7. The method of claim 1, wherein the step of stacking the first printed circuit board relative to the second printed circuit board to form a stacked, printed circuit assembly is performed without using any standoffs, connectors, or solder.

8. The method of claim 1, wherein the first adhesive layer encapsulates electrical components of the at least one of the first printed circuit board and the second printed circuit board.

9. The method of claim 8, wherein the adhesive layer is applied so as to fully encapsulate all electrical components of the at least one of the first printed circuit board and the second printed circuit board.

10. The method of claim 9, wherein the adhesive layer is applied so as to fully encapsulate each of the first plurality of electrical components and each of the second plurality of electrical components.

11. A method for assembling a printed circuit assembly, the method comprising the steps of:
    obtaining a first printed circuit board electrically coupled with a second printed circuit board along at least one flexible coupling member, wherein the first printed circuit board comprises a rigid, printed circuit board having a flexibility less than a flexibility of the flexible coupling member, wherein the second printed circuit board comprises a rigid, printed circuit board having a flexibility less than the flexibility of the flexible coupling member, wherein the first printed circuit board comprises a first plurality of electrical components, and wherein the second printed circuit board comprises a second plurality of electrical components;
    applying a first adhesive layer to at least one of the first printed circuit board and the second printed circuit board, wherein the first adhesive layer forms a layer along each electrical component of the at least one of the first printed circuit board and the second printed circuit board, and wherein the first adhesive layer encapsulates electrical components of the at least one of the first printed circuit board and the second printed circuit board; and
    stacking the first printed circuit board relative to the second printed circuit board to form a stacked, printed circuit assembly.

* * * * *